ROTATED Y-CUT RECTANGULAR PIEZOELECTRIC QUARTZ CRYSTAL PLATES

Filed April 16, 1965 4 Sheets-Sheet 1

INVENTOR
J. J. ROYER

BY H. O. Wright
ATTORNEY

United States Patent Office 3,375,379

Patented Mar. 26, 1968

3,375,379

ROTATED Y-CUT RECTANGULAR PIEZO-ELECTRIC QUARTZ CRYSTAL PLATES

James J. Royer, Allentown, Pa., assignor to Bell Telephone Laboratories, Incorporated, New York, N.Y., a corporation of New York Continuation-in-part of application Ser. No. 402,488, Oct. 8, 1964. This application Apr. 16, 1965, Ser. No. 448,601

18 Claims. (Cl. 310—9.5)

ABSTRACT OF THE DISCLOSURE

The specification describes rectangular DT-cut quartz crystals which are designed with optimum width-to-length and width-to-thickness ratios to minimize unwanted resonances.

To the extent that this application supplies additional information relating to piezoelectric quartz crystal plate elements of the type disclosed and claimed in my copending application Serial No. 402,488, filed Oct. 8, 1964, now Patent No. 3,334,351, the present application is a continuation-in-part of said copending application.

This invention relates to rectangular piezoelectric quartz crystal plate elements for use in frequency selective apparatus such as wave filters, oscillators and the like. More particularly, it relates to new and improved species of the so-called DT-cut rectangular piezoelectric quartz crystal plate.

A typical prior art species of the so-called DT-cut rectangular piezoelectric quartz crystal plate is disclosed, for example, in United States Patent 2,111,384, granted Mar. 15, 1938, to S. A. Bokovoy, and is a rotated Y-cut rectangular piezoelectric quartz crystal plate having a width to length ratio which may be substantially 0.4, the length dimension and the major surfaces of the plate being parallel to the X-axis, and the width dimension and major surfaces being at an angle of approximately minus 51 degrees 30 minutes with respect to the Z-axis of the quartz crystal from which the plate is cut. Species of DT-cut plates of this type will be referred to as X-length plates. They are driven in the face-shear mode and can be proportioned to provide a substantially constant principal resonance frequency over a wide range of temperature. Furthermore, a substantial increase in the quality factor "Q" (ratio of reactance to resistance) is obtained, as compared with that of "square" DT-cut rectangular piezoelectric quartz crystal plates in which the ratio of the major face dimensions (width to length) is substantially unity (that is, ratio $W/L \approx 1$).

As is well known to those skilled in the art, spurious or unwanted resonances may, when the rectangular piezoelectric quartz crystal plates are employed in wave filters, produce unwanted spikes of high attenuation at frequencies where free transmission is required (that is, within the pass band) or a substantial decrease of attenuation at specific frequencies where high attenuation is required. When rectangular piezoelectric quartz crystal plates are employed in oscillators, or the like, spurious or unwanted resonances at frequencies near that of the principal or wanted resonance may result in the frequency of oscillation "jumping" from the frequency of the principal or wanted resonance to that of an adjacent spurious or unwanted resonance.

In my above-mentioned copending application, it is disclosed that by further restricting rectangular piezoelectric quartz crystal plates of the general type (X-length plates) suggested by Bokovoy to thickness to width, or $T/W$, ratios falling within specific regions, spurious or unwanted thickness resonances may readily be eliminated from frequency regions within five percent of the principal or wanted face-shear resonance frequency, and at two specific optimum values of the thickness to width ratios within said regions spurious or unwanted thickness resonances may be eliminated from frequency regions within ten percent of the principal or wanted face-shear resonance frequency. Insofar as it is pertinent to the present invention, the said copending application is incorporated by reference as an integral part of the disclosure of the present application.

In the present application, it is disclosed that still wider frequency bands free from spurious or unwanted thickness resonance frequencies in the vicinity of the principal or wanted resonance frequency can be realized by cutting the rectangular piezoelectric quartz crystal plate as a so-called DT plate but with its width (rather than its length) parallel to the X-axis and with its length dimension at an angle of approximately minus 54 degrees with respect to the Z-axis. It has been found that "X-width" DT-cut plates includes two new species having width to length ratios in the vicinities of 0.35 and 0.225, respectively, and that these species are, for reasons discussed herein below, preferable to species having a width to length ratio of 0.4 or greater. Specific thickness to width ratio ranges of these two new X-width species, as described in detail hereinbelow, afford enhanced freedom from spurious or unwanted resonances at frequencies proximate to the principal or wanted resonance frequency.

The advantages of cutting the DT-cut rectangular piezoelectric quartz crystal plate with its width parallel to the X-axis result principally from applicant's discovery that, for appropriately proportioned plates, fewer and lower order thickness flexure modes, more widely separated in frequency than for former species of DT-cut plates, are excited in the new species of these plate. Adjustment or the thickness can then effect placement of the spurious or unwanted resonance frequencies to afford optimum separation from the principal or wanted resonance frequency superior to that obtainable with prior art rectangular DT-cut plates.

An additional advantage afforded by the new X-width rectangular quartz crystal plates of the invention having a ratio of width to length of approximately .225 (that is, $W/L \approx .225$) is that, for specific principal or wanted resonance frequencies, the new crystal plates have greater mass and, consequently, more practicable (substantially larger) dimensions. This is significant since at the higher frequencies of their useful ranges where the dimensions required for prior art conventional rectangular DT plates become too small to be readily manufactured and used plates of this design can still be readily manufactured and used.

Also, in the frequency range in which plates of the present application and those of applicant's above-mentioned copending application have practicable dimensions and may all be used, the dimensions of the several designs or types, as will be discussed in more detail hereinbelow, differ sufficiently from each other when dimensioned for substantially the same principal or wanted resonance frequency that visual inspection on the basis of over-all size suffices to distinguish each from the others. This eliminates possible confusion and facilitates labeling and manufacture.

This is particularly so where, for example, a wave filter or the like employs several quartz crystal plates having substantially the same or only moderately differing principal or wanted resonance frequencies. Indeed, there are many instances, for example, where if all the crystal plates were made of a single design or type, the dimensional differences for plates having only the usual modest differences in their respective principal or wanted resonant frequencies would not be sufficient that they could be readily distinguished simply by visual inspection. More time consuming electromechanical tests and meticulous care in marking or labeling to avoid confusing the differing plates with each other would then be required.

Furthermore, by employing crystal plates of differing design or type, the spurious or unwanted resonances of each will occur at frequencies different from the frequencies at which spurious or unwanted resonances of the other designs will occur and the cumulative effect which would be likely to be encountered were they all of substantially the same design is thus avoided. Such cumulative effects when several plates of substantially the same design are used may prove difficult to eliminate.

A further advantage of the X-width crystal plates of the present invention, which incidentally is shared by the X-length plates of applicant's above-mentioned copending application, is that during vibration at the principal or wanted resonance frequency a nodal line, instead of the usual small nodal point, is generated along the longitudinal axis of the plate. Accordingly, when mounted in the conventional manner for such small plates, that is, by a pair of fine or thin wires connected respectively to substantially the oppositely disposed center points of the two major surfaces, a minimum amount of vibrational energy is imparted to the thin wires and dissipated in the associated mounting structures. Accordingly, plates of applicant's copending application and those of the present application all have exceptionally high quality factors (that is, "Q's" or ratios of reactance to resistance).

A still further advantage in connection with the X-width rectangular piezoelectric quartz crystal plates of the invention is that the temperature at which the "temperature turnover point," that is, the temperature of the frequency versus temperature characteristic about which minimum variation of frequency over normal operating temperature ranges is encountered, can be substantially determined by selecting the appropriate negative angle with respect to the Z-axis at which the plate is cut from the mother crystal. Thereafter the length, width, and thickness dimensions of the plate can be adjusted to impart the desired principal resonance frequency and its isolation from spurious or unwanted resonances while affecting the temperature turnover point to a lesser degree than that of a square plate.

This is a distinct advantage over many prior art DT-cut rectangular quartz crystal plates, such, for example, as those disclosed in United States Patent 2,213,031, granted Aug. 27, 1940, to J. M. Wolfskill, where adjustments of the dimension of the plates do materially change the temperature turnover point as well as alter the principal or wanted resonance frequency of the plate. This obviously increases the complexity of the problem of adjusting the crystal plate to obtain the desired principal resonance frequency, the desired temperature turnover point and the required isolation of the wanted resonance from spurious or unwanted resonances.

A principal object of the invention is, accordingly, to eliminate spurious or unwanted thickness resonances from wide frequency regions about selected principal or wanted resonance frequencies of DT-cut rectangular piezoelectric quartz crystal plates.

Another object is to reduce the difficulties arising from the very small physical dimensions at high principal or wanted resonance frequencies of DT-cut rectangular piezoelectric quartz crystal plates.

A further object is to facilitate identification by visual inspection of a number of DT-cut rectangular piezoelectric quartz crystal plates having principal or wanted resonance frequencies which differ by only small amounts.

A still further object is to reduce energy losses in the mounting structures supporting DT-cut rectangular piezoelectric quartz crystal plates.

Yet another object is to facilitate fixing the temperature turnover point, and the principal resonance frequency, and eliminating spurious resonance proximate to the wanted resonance frequency.

The above and other objects, features and advantages of DT-cut rectangular X-width piezoelectric quartz crystal plates of the invention will become apparent from a perusal of the detailed description of specific illustrative embodiments of the invention given hereinbelow in conjunction with the appended claims and the accompanying drawing, in which:

Figure 4:
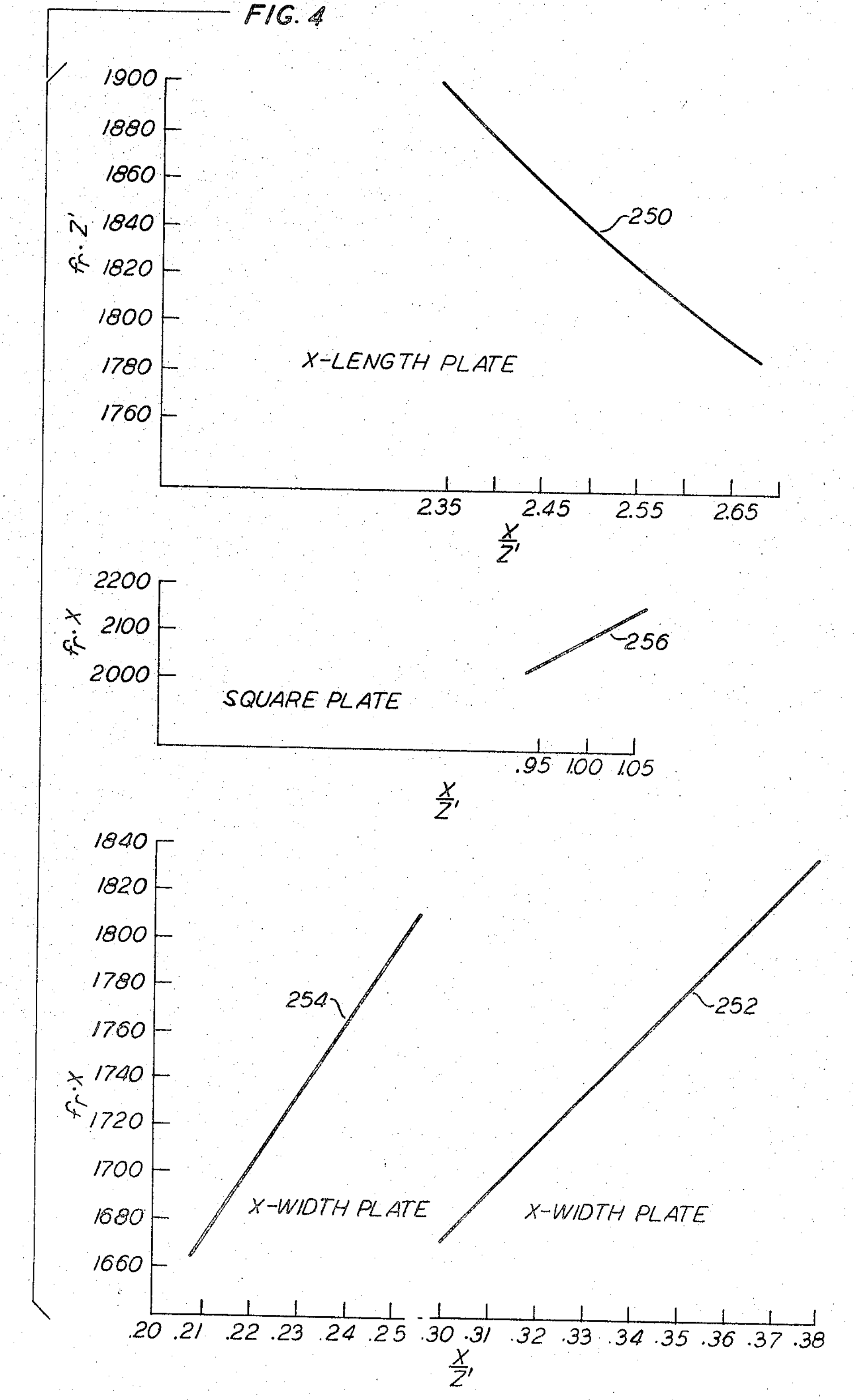
Figure 5:
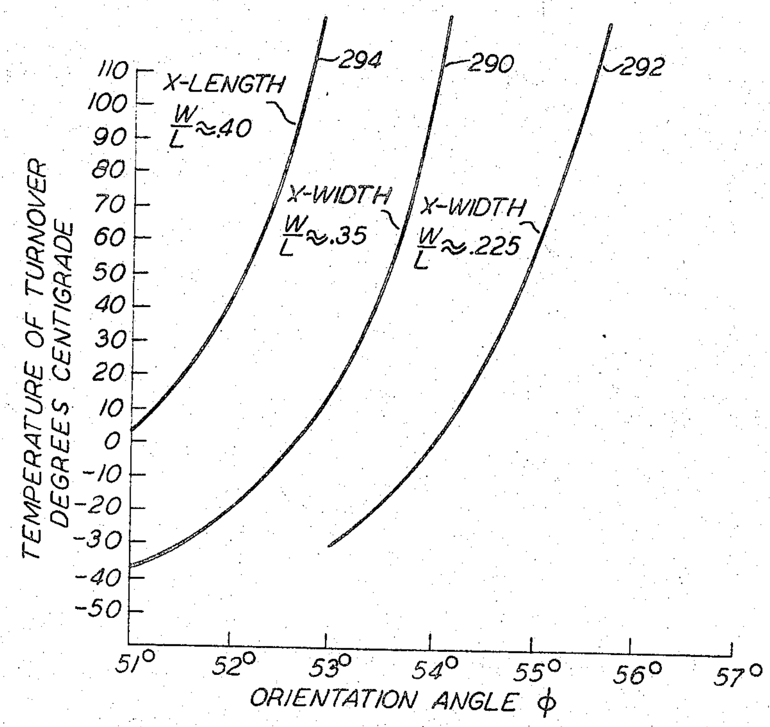

FIG. 4 presents graphs of the variations for various X-dimension to thickness ratios of the frequency constants of X-width, X-length and substantially square DT-cut piezoelectric quartz crystal plates, respectively; and FIG. 5 is a graph representing the relation between the angle Φ and the temperature turnover point for quartz crystal plates of the invention.

Figure 1:
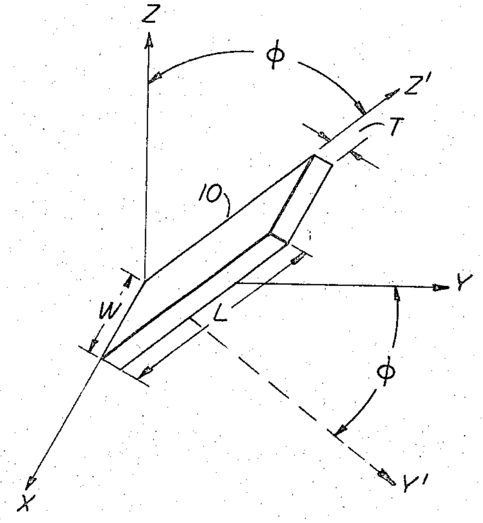
FIG. 1 is illustrative of the orientation of X-width rectangular piezoelectric quartz crystal plates of the invention with respect to the axes of the single or mother crystal of quartz from which they are cut.

In more detail in FIG. 1, a representative rectangular X-width piezoelectric quartz crystal plate 10 of the invention is illustrated.

The width W of the plate and its major faces are parallel to the X-axis. The plate is rotated about the X-axis so that its length L and its major faces are at a negative angle Φ with respect to the Z-axis. As will be discussed in detail hereinbelow, the angle Φ may vary within a range of a few degrees from nominal values of minus 53 degrees 10 minutes for a ratio of $W/L$ of approximately 0.35 and minus 54 degrees 40 minutes for a ratio of $W/L$ of approximately 0.225.

For these X-width plates the length is, in accordance with conventional parlance in the art, said to lie along the Z' axis and the thickness is said to lie along the Y' axis. The position of the latter Y' axis is determined by imagining the Y-axis to have been rotated by the same negative angle Φ in the YZ plane.

Preferred and optimum dimensional ratios such as the width to length and thickness to width ratios will be discussed in more detail hereinbelow.

Figure 2:
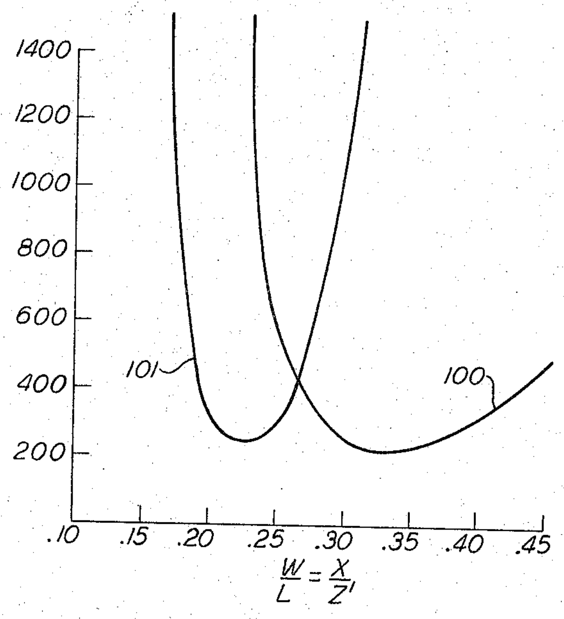
FIG. 2 is a graph indicating the relations between the ratio of width to length and the ratio of capacities for rectangular piezoelectric quartz crystal plates of the invention.

In FIG. 2, curves 100 and 101 illustrate the variation of "the ratio of capacitances" with the ratio of the X-dimension or width to length of the X-width plates of the present invention.

As is well known to those skilled in the art, the ratio of capacitances is expressed exactly by $$\frac{f_R^2}{f_A^2-f_R^2}=\frac{f_R^2}{(f_A+f_R)(f_A-f_R)}$$

and substantially by the relation $$\frac{f_R}{2(f_A-f_R)}$$

where $f_R$ is the principal resonance frequency of the crystal plate and $f_A$ is the antiresonance frequency of (or associated with) the principal resonance frequency of the crystal plate.

Since, as is also well known to those skilled in the art, it is desirable that the ratio of capacitances should be as small as practicable, it is concluded by inspection of curves 100 and 101 that favorable width to length ratios lie within the ranges from 0.32 to 0.38 and 0.20 to 0.25.

with optimum values within these ranges at substantially 0.35 and 0.225, respectively.

Figure 3:
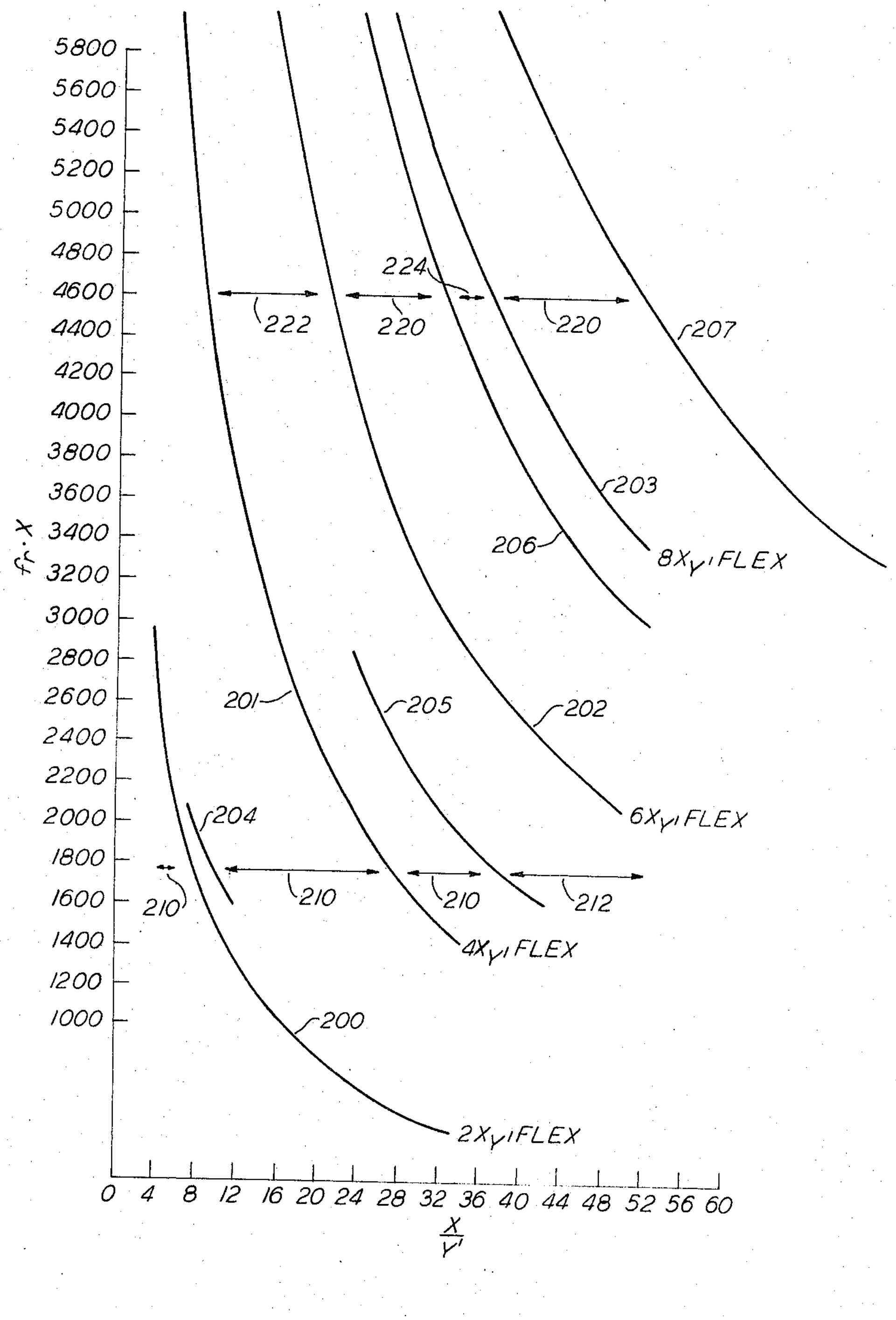
FIG. 3 is a graph indicating the relative locations of the main spurious or unwanted thickness resonances to the ratio of width to thickness for rectangular piezoelectric X-width quartz crystal plates of the invention and the X-length plates of applicant's abovementioned copending application for their several respective frequency constants.

In FIG. 3, curves 200 through 203, inclusive, represent spurious or unwanted resonance frequencies of the second, fourth, sixth and eighth width-thickness modes, respectively (designated XY' modes for the purposes of the present invention), and curves 204 through 207, inclusive, represent spurious or unwanted width-thickness resonance frequencies of more complex character, all being plotted in terms of the ratio of the X-dimension to the Y'-dimension of the plate versus the frequency constant (product of the X-dimension times the principal resonance frequency for the rectangular piezoelectric quartz crystal plates discussed in the present application). This choice of parameters makes possible a direct comparison between the X-width plates of the present application and the X-length of my above-mentioned copending application.

The lower group of horizontal lines 210 at a frequency constant of substantially 1780 indicate usable ranges for rectangular X-width plates of the present invention. These lines correspond to ranges of ratios of 4–6, 11–26, and 29–36. The range 212 is not recommended since, in view of the relatively smaller thickness dimensions required of the plates in this range, it would not be readily practicable to manufacture and use such thin plates.

The upper horizontal lines 220 at a frequency constant of substantially 4600 represent usable ranges for rectangular X-length plates of my above-mentioned copending application and are presented here for purposes of comparison.

The range 222 is not recommended for crystal plates to be used in electrical wave filters because of undesirably large inductive components. The range 222 may, however, well be used where high inductive components are permissible, as for example in high stability oscillators where a higher Q can be obtained solely by using a large thickness dimension.

The range 224 is deemed to be too narrow to be of any substantial utility.

By inspection, it is apparent that designs of X-width plates in accordance with the present invention make possible the selection of thickness ratios at which spurious or unwanted thickness resonances will on a percentage basis be appreciably more remote from the principal or wanted resonance than for prior art plates including plates of my above-mentioned copending application.

In FIG. 4, graphs are presented illustrating the relations between various ratios of the X-dimension and the Z'-dimension and the corresponding frequency constant. For X-width plates of the present invention the X-dimension is, of course, the width W and the Z'-dimension is the length L. For X-length plates of my above-mentioned copending application, the X-dimension is of course the length L and the Z'-dimension is the width W.

Graph 250 is applicable to X-length plates of my copending application and the frequency constant is the product of the Z'-dimension or width W and the principal resonant frequency of the plate.

Graphs 252 and 254 are applicable to X-width plates of the present invention for Case I and Case II, respectively, as described hereinunder, and the frequency constant is in both instances the product of the X-dimension or width W and the principal resonant frequency of the plate.

Similarly, graph 256 is applicable to substantially square plates of the prior art and the frequency constant is the product of the X-dimension (that is, the side of the approximately square plate which is parallel to the X-axis) and the principal resonant frequency of the plate.

In designing any of these plates, a ratio of X-dimension to Z'-dimension is first selected based on whether an X-length, and X-width, or a substantially square plate is desired.

From the appropriate graph of FIG. 4 the frequency constant is then ascertained and this combined with the above-mentioned X to Z' ratio fixes the length and width of the plate.

Recourse is then had to FIG. 3 where for the ascertained frequency constant an appropriate ratio of X-dimension (width or length) to Y'-dimension (thickness) is selected such that the principal resonance will have no spurious or unwanted resonances in close proximity thereto. The thickness may of course be calculated from the last-mentioned ratio.

The temperature turnover point may be varied from minus 30 degrees centigrade to plus 100 degrees centigrade for angles of cut (Φ) between minus 53 degrees 00 minutes to minus 56 degrees 00 minutes and is substantially determined by the angle selected as illustrated by graph 292 of FIG. 5.

Ratios of width X to thickness Y' may be selected within the same ranges as given above for the plates of Case I.

Corresponding temperature turnover values versus angle Φ for X-length plates of my above-mentioned copending application are illustrated in graph 294 of FIG. 5.

For purposes of specific comparison with respect to dimensions, assume that rectangular piezoelectric quartz crystal plates of the three above-mentioned plate designs, namely, the X-length design of my above-mentioned copending application, and one each of the X-width designs designated as Case I and Case II, described above, are each to have (1) their principal or wanted resonance frequency at 500 kilocycles per second, (2) a substantially constant frequency for moderate temperature changes about a nominal room temperature of 25 degrees centigrade, and (3) optimum freedom from spurious or unwanted resonances in the vicinity of their respective principal or wanted resonance frequency.

A plate designed in accordance with my abovementioned copending application would have a length of 9.20 millimeters, a width of 3.68 millimeters, and a thickness of 0.34 millimeter. The nearest spurious or unwanted width-thickness resonance would be at 590 kilocycles per second. The angle of the cut Φ would be minus 51 degrees 30 minutes and may be selected from graph 294 of FIG. 5.

A plate designed from the Case I design, above described, would have a length of 10.10 millimeters, a width of 3.54 millimeters, and a thickness of 0.18 millimeter. The nearest spurious or unwanted width-thickness resonance would be at 675 kilocycles per second. The angle of the cut Φ would be minus 53 degrees 10 minutes (graph 290 of FIG. 5).

A plate designed per type Case II, above described, would have a length of 15.45 millimeters, a width of 3.58 millimeters, and a thickness of 0.17 millimeter. The nearest spurious or unwanted width-thickness resonance would be at 675 kilocycles per second. The angle of the cut Φ would be minus 54 degrees 30 minutes (graph 292 of FIG. 5).

It should be noted that the Case II plate is substantially fifty percent longer than the others and that the X-length plate of my copending application is substantially ten percent shorter than the Case I plate so that by visual inspection each of the three plates can be readily distinguished from the others. Also, at higher frequencies, it is obvious that the plate dimensions will be proportionately smaller so that the Case II plate may still have feasible dimensions at frequencies for which the dimensions of the other plates become impracticably small.

As pointed out above, the rectangular piezoelectric quartz crystal plates as described in this application provide virtually independent control of (1) frequency by selection of the width and length dimensions, (2) temperature turnover point by selection of the angle Φ of the cut, and (3) spacing of nearest spurious or unwanted resonances by selection of the thickness dimension.

Numerous and varied modifications and rearrangements of the above-described illustrative embodiments can be readily devised by those skilled in the art without departing from the spirit and scope of the principles of the invention. Accordingly, it is to be expressly understood that the disclosed embodiments are illustrative but in no way limiting of the inventive principles.

What is claimed is:

1. A rectangular piezoelectric quartz crystal plate having a width to length ratio within the ranges 0.20 to 0.25 and 0.32 to 0.38, the width dimension of the plate being parallel to the X-axis, the length dimension of the plate being at a negative angle Φ within the range of minus 51 degrees to a minus 56 degrees with respect to the Z-axis.

2. The plate of claim 1 in which the ratio of width to thickness is within the range of 4 to 39.

3. A rectangular piezoelectric quartz crystal plate having a width to length ratio within the range 0.20 to 0.25, the width dimension of the plate being parallel to the X-axis, the length dimension of the plate being at a negative angle Φ within the range of minus 53 degrees to minus 56 degrees with respect to the Z-axis.

4. A rectangular piezoelectric quartz crystal plate having a width to length ratio within the range 0.32 to 0.38, the width of the plate being parallel to the X-axis, the length of the plate being at a negative angle Φ within the range of minus 51 degrees to minus 54 degrees with respect to the Z-axis.

5. A rectangular piezoelectric quartz crystal plate having a width to length ratio of substantially 0.35, the width dimension of the plate being parallel to the X-axis, the length dimension of the plate being at a negative angle Φ within the range of minus 53 degrees to minus 56 degrees with respect to the Z-axis.

6. A rectangular piezoelectric quartz crystal plate having a width to length ratio of substantially 0.225, the width dimension of the plate being parallel to the X-axis, the length dimension of the plate being at a negative angle Φ within the range of minus 53 degrees to minus 56 degrees with respect to the Z-axis.

7. The plate of claim 1 in which the width to thickness ratio is within the ranges of 4 to 6, 11 to 26, and 29 to 36.

8. The plate of claim 3 in which the width to thickness ratio is within the ranges of 4 to 6, 11 to 26, and 29 to 36.

9. The plate of claim 4 in which the width to thickness ratio is within the ranges of 4 to 6, 11 to 26, and 29 to 36.

10. The plate of claim 1 in which the width to thickness ratio is within the range of 4 to 6.

11. The plate of claim 1 in which the width to thickness ratio is within the range of 11 to 26.

12. The plate of claim 1 in which the width to thickness ratio is within the range of 29 to 36.

13. The plate of claim 3 in which the width to thickness ratio is within the range of 4 to 6.

14. The plate of claim 3 in which the width to thickness ratio is within the range of 11 to 26.

15. The plate of claim 3 in which the width to thickness ratio is within the range of 29 to 36.

16. The plate of claim 4 in which the width to thickness ratio is within the range of 4 to 6.

17. The plate of claim 4 in which the width to thickness ratio is within the range of 11 to 26.

18. The plate of claim 4 in which the width to thickness ratio is within the range of 29 to 36.

References Cited

UNITED STATES PATENTS

| | | | |
|---|---|---|---|
| 3,072,806 | 1/1963 | Sogan | 310—9.5 |
| 2,795,708 | 6/1957 | Brooks | 310—9.5 |
| 2,574,257 | 11/1951 | Franklin | 310—9.5 |
| 2,485,129 | 10/1949 | Baerwald | 310—9.5 |
| 2,436,202 | 2/1948 | Cress | 310—9.5 |
| 3,306,909 | 12/1942 | Sykes | 310—9.5 |
| 2,304,760 | 12/1942 | Gerber | 310—9.5 |
| 2,303,375 | 12/1942 | Mason | 310—9.5 |
| 2,111,384 | 3/1938 | Bokovoy | 310—9.5 |

MILTON O. HIRSHFIELD, *Primary Examiner.*

J. D. MILLER, *Examiner.*